United States Patent
Reithinger et al.

(10) Patent No.: US 6,730,989 B1
(45) Date of Patent: May 4, 2004

(54) SEMICONDUCTOR PACKAGE AND METHOD

(75) Inventors: Manfred Reithinger, Essex, VT (US); Mike Killian, Richmond, VT (US); Gerd Frankowsky, Taufkirchen (DE); Oliver Kiehl, Charlotte, VT (US); Gerhard Mueller, Meitingen (DE); Ernst Stahl, Essex Junction, VT (US); Hartmud Terletzki, Pleasant Valley, NY (US); Thomas Vogelsang, Jericho, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/596,130

(22) Filed: Jun. 16, 2000

(51) Int. Cl.[7] ............................................. H01L 23/544
(52) U.S. Cl. ..................... 257/620; 257/786; 257/707; 438/106; 438/113
(58) Field of Search .................. 438/106, 110, 438/113, 125; 257/620, 692, 786, 207, 210, 48, 707, 600, 601

(56) References Cited

U.S. PATENT DOCUMENTS

| | | | |
|---|---|---|---|
| 5,047,711 A | * | 9/1991 | Smith et al. ................. 257/707 |
| 5,192,716 A | | 3/1993 | Jacobs |
| 5,459,684 A | | 10/1995 | Nakamura et al. |
| 5,535,152 A | | 7/1996 | Han et al. |
| 5,637,916 A | * | 6/1997 | Joshi .......................... 257/668 |
| 5,659,519 A | | 8/1997 | Lee et al. |
| 5,696,404 A | | 12/1997 | Murari et al. |
| 5,739,546 A | | 4/1998 | Saitou et al. |
| 5,770,476 A | * | 6/1998 | Stone |
| 6,066,886 A | | 5/2000 | Egawa |
| 6,121,677 A | | 9/2000 | Song et al. |
| 6,157,213 A | * | 12/2000 | Voogel ......................... 326/41 |
| 6,233,184 B1 | * | 5/2001 | Barth et al. ................. 365/201 |
| 6,262,587 B1 | * | 7/2001 | Whetsel ....................... 324/765 |
| 6,365,443 B1 | * | 4/2002 | Hagiwara et al. ........... 438/130 |
| 2001/0001502 A1 | | 5/2001 | Wong |
| 2001/0042901 A1 | | 11/2001 | Maruyama |
| 2001/0052635 A1 | | 12/2001 | Takayama |

FOREIGN PATENT DOCUMENTS

| | | | |
|---|---|---|---|
| EP | 918354 | * | 5/1999 |
| JP | 63-234553 | | 9/1988 |
| JP | 01-220843 | | 9/1989 |
| JP | 406013447 A | | 1/1994 |
| WO | WO-98/33211 | | 7/1998 |

* cited by examiner

*Primary Examiner*—Caridad Everhart
(74) *Attorney, Agent, or Firm*—Slater & Matsil, LLP

(57) ABSTRACT

A semiconductor packaging arrangement, or module, includes a printed circuit board having an electrical interconnect thereon and a semiconductor package mounted to the printed circuit board. The semiconductor package includes a fractional portion of a semiconductor wafer having a plurality of integrated circuit chips thereon, such chips being separated by regions in the fractional portion of the wafer. The fractional portion of the wafer has a plurality of electrical contacts electrically connected to the chips. The package also includes a dielectric member having an electrical conductor thereon. The electrical conductor are electrically connected to the plurality of electrical contacts of the plurality of chips to electrically interconnect such plurality of chips with portions of the electrical conductor spanning the regions in the fractional portion of the wafer. A connector is provided for electrically connecting the electrical conductor of the package to the electrical interconnect of the printed circuit board.

22 Claims, 13 Drawing Sheets

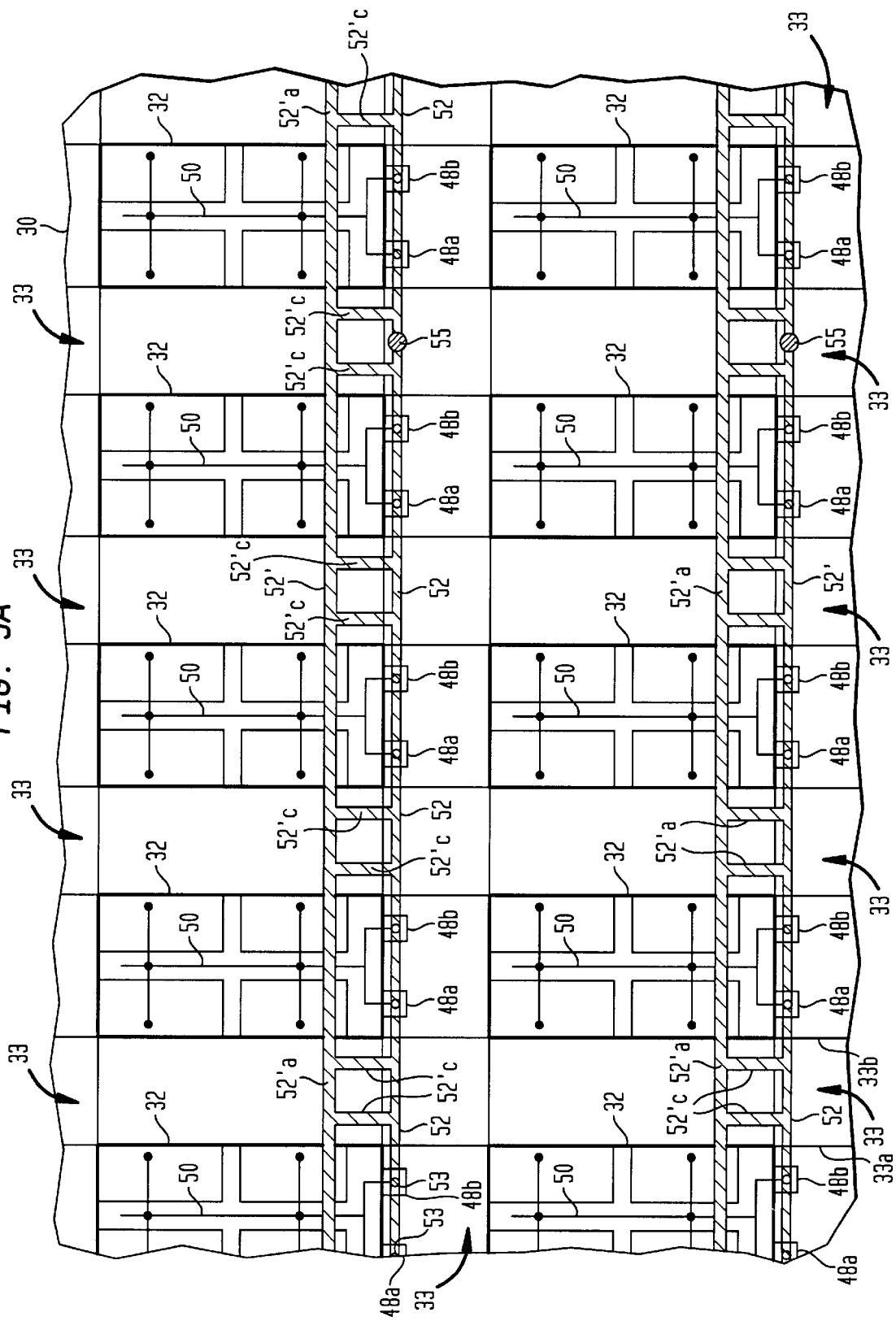

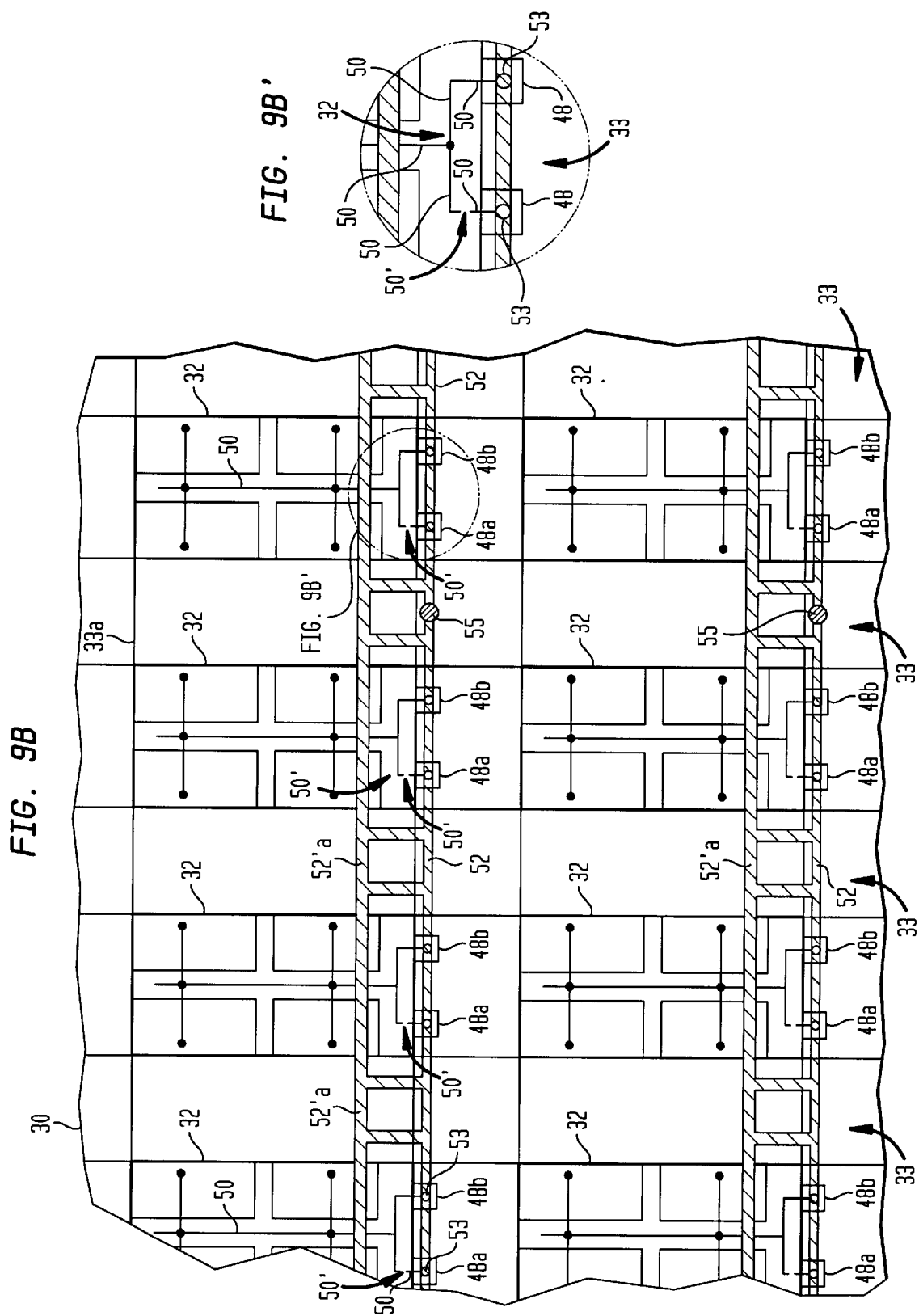

SEMICONDUCTOR PACKAGE AND METHOD

BACKGROUND OF THE INVENTION

This invention relates generally to semiconductor packages and to modules having such packages.

As is known in the art, semiconductor packing is typically performed by forming a plurality of identical integrated circuit chips on a semiconductor wafer. Also formed on the wafer during the fabrication of the chips is a plurality of scribe lines, or kerfs, which separate the chips. The integrated circuit chip definition is essentially complete at this wafer processing level. Some modification using electrical or laser fusing is possible such as spare, or redundant element replacement and circuit parameter (e.g., resistance) trimming, but this is limited to electrical elements with a single chip.

The wafer is then tested. The individual chips are then diced (i.e., separated) by scribing and breaking along the scribe lines. The now separated chips are individually packaged, re-tested, and sold as individual packaged chips. Typically, these individually packaged chips are mounted to a printed circuit board (PCB). For example, when the chips are Dynamic Random Access Memories (DRAMs), the individual packaged chips are mounted to a PCB to provide a memory module, such as a Single In-Line Memory Module (SIMM), Dual In-Line Memory Module (DIMM), or Rambus In-Line Memory Module (RIMM).

As is also known in the art, a DRAM chip typically includes two regions: memory array regions; and, non-memory array regions. These non-memory array regions are generally referred to as regions peripheral to the array regions or merely as peripheral regions. More particularly, referring to FIG. 1, a semiconductor wafer 10 is shown having a plurality of identical semiconductor chips 12. The fabricated chips 12 are then separated along the scribe lines 14. The borders of the scribe lines 14 shown more clearly in FIG. 2 and are designated as 14a, 14b, such FIG. 2 showing a portion of the wafer 10 shown in FIG. 1. Thus, an exemplary one of the chips 12 is shown in detail in FIG. 2 to include memory array regions, here four memory array regions 16 and peripheral regions 17. Each array region 16 includes the DRAM memory cells and associated row and column decoders, not shown. The peripheral regions 17 typically include decoders and sense amplifiers, not shown. Also included in the peripheral region 17 of each chip 12 is, in this example, a pair of voltage generators 20. Also disposed in the peripheral regions 17 are power busses 22 which electrically interconnect the voltage generators 20 to the array regions 16. In a conventional DRAM semiconductor chips, the voltage generators 20 occupy up to several percent of the total chip 12.

SUMMARY OF THE INVENTION

In accordance with the present invention, a semiconductor package is provided. The package includes a fractional portion of a semiconductor wafer having a plurality of integrated circuit chips thereon. The chips have separating regions between them. The fractional portion of the wafer has a plurality of electrical contacts electrically connected to the chips. The package also includes an electrical conductor to electrically connect the plurality of electrical contacts electrically interconnecting such chips with portions of the electrical conductor spanning the separating regions between the chips in the fractional portion of the wafer.

With such an arrangement, rather than have each individual chip in a separate package, the chips are designed for module granularity enabling the entire fractional portion of the wafer (i.e., portions thereof which are not used in the circuitry of the individual chips) to be utilized in an optimum manner.

In accordance with one embodiment, a semiconductor package is provided. The package includes a fractional portion of a semiconductor wafer having a plurality of integrated circuit chips thereon. The chips have separating regions between them. The fractional portion of the wafer has a plurality of electrical contacts electrically connected to the chips. The package also includes a dielectric having an electrical conductor thereon. The electrical conductor electrically connects the plurality of electrical contacts to electrically interconnect such chips with portions of the electrical conductor spanning the separating regions between the chips in the fractional portion of the wafer.

In accordance with the present invention, a semiconductor package is provided. The package includes a fractional portion of a semiconductor wafer having a plurality of integrated circuit chips thereon. The chips have separating regions between them. Peripheral electrical components are disposed in the separating regions. The package also includes an electrical conductor to electrically connect the plurality of electrical contacts to electrically interconnect such chips with peripheral electrical components In accordance with one embodiment of the invention, a semiconductor memory is provided. The memory includes a fractional portion of a semiconductor wafer. The fractional portion of the wafer has a plurality of integrated circuit chips. Each one of such chips has a memory array region. The chips have separating regions between them. A periphery electrical component is disposed on the fractional portion of the wafer in one of the separating regions An electrical interconnect is provided for electrically connecting the chip to the periphery electrical component.

With such an arrangement, the periphery components are added to the memory in a more efficient manner as compared to a module having only a single integrated circuit memory chip. Several benefits of this efficiency are: an averaging of elements to reduce variations; sharing of chip elements to increase the number of chips per wafer; selecting circuit options; and, wiring across the chips within the module.

In accordance with another embodiment of the invention, a semiconductor memory package is provided having a fractional portion of a semiconductor wafer. The fractional portion of the wafer has a plurality of integrated circuit chips. Each one of such chips has a memory array region. The chips have separating regions therebetween. A periphery electrical component is disposed in one of the separating regions. An electrical interconnect is provided for electrically connecting the chip to the peripheral electrical component.

In accordance with another embodiment of the invention, a semiconductor packaging arrangement, or module, is provided. The module includes a printed circuit board having an electrical interconnect thereon and a semiconductor package mounted to the printed circuit board. The semiconductor package includes a fractional portion of a semiconductor wafer having a plurality of integrated circuit chips thereon, such chips being separated by regions in the fractional portion of the wafer. The fractional portion of the wafer has a plurality of electrical contacts electrically connected to the chips. The package also includes a dielectric having an electrical conductor thereon. The electrical conductor are electrically connected to the plurality of electrical contacts of the plurality of chips to electrically interconnect such plurality of chips with portions of the electrical conductor spanning the regions in the fractional portion of the wafer. A connector is provided for electrically connecting the electrical conductor of the package to the electrical interconnect of the printed circuit board. In accordance with another embodiment of the invention, a semiconductor memory is provided having a fractional portion of a semiconductor wafer. The fractional portion has a plurality of integrated circuit chips. Each one of such chips has a memory array region. The chips have separating regions therebetween. A periphery electrical component is disposed in one of the separating regions. An electrical interconnect electrically connects the chips to the periphery electrical component.

With such an arrangement, the same periphery electrical component is shared by the chips.

In accordance with still another embodiment of the invention, a method is provided for providing a packaging arrangement. The method includes providing a semiconductor wafer having formed thereon a plurality of semiconductor chips, such chips being separated by regions in the wafer, such wafer having a plurality of electrical contacts electrically connected to the chips. A dielectric member is provided having thereon an electrical conductor. The dielectric member is positioned over the wafer with the electrical conductor being disposed on the plurality of electrical contacts and with such electrical conductor spanning the regions. The positioned dielectric member is connected to the semiconductor wafer to provide a unitary structure. The unitary structure is separated into a plurality of packages, each one of the packages having a plurality of the chips with the electrical contacts of the plurality of the chips in such package being electrically connected to a corresponding portion of the spanning electrical conductor in such package.

In one embodiment, a printed circuit board is provided having an electrical interconnect thereon; and, electrically interconnecting the electrical conductor of the package to the electrical interconnect.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 9A through 9D are plan views of a portion of a wafer with a dielectric member disposed over such portion of the wafer and with such dielectric member having electrical conductors thereon in contact with electrical contacts electrically connected to chips in such portion of the wafer, such electrical conductors being shown using cross-hatching, such FIGS. 9A through 9D showing such structure at various stages in the fabrication thereof to provide an interconnection of voltage generators formed thereon in accordance with the invention;

FIG. 9B' is an enlarged view of a portion of the wafer shown in FIG. 9B, such portion being enclosed by an arrow designated 9B'—9B' is FIG. 9B;

FIG. 9C' is an enlarged view of a portion of the wafer shown in FIG. 9B, such portion being enclosed by an arrow designated 9C'—9C' is FIG. 9B;

Like reference symbols in the various drawings indicate like elements.

DETAILED DESCRIPTION

Figure 1:
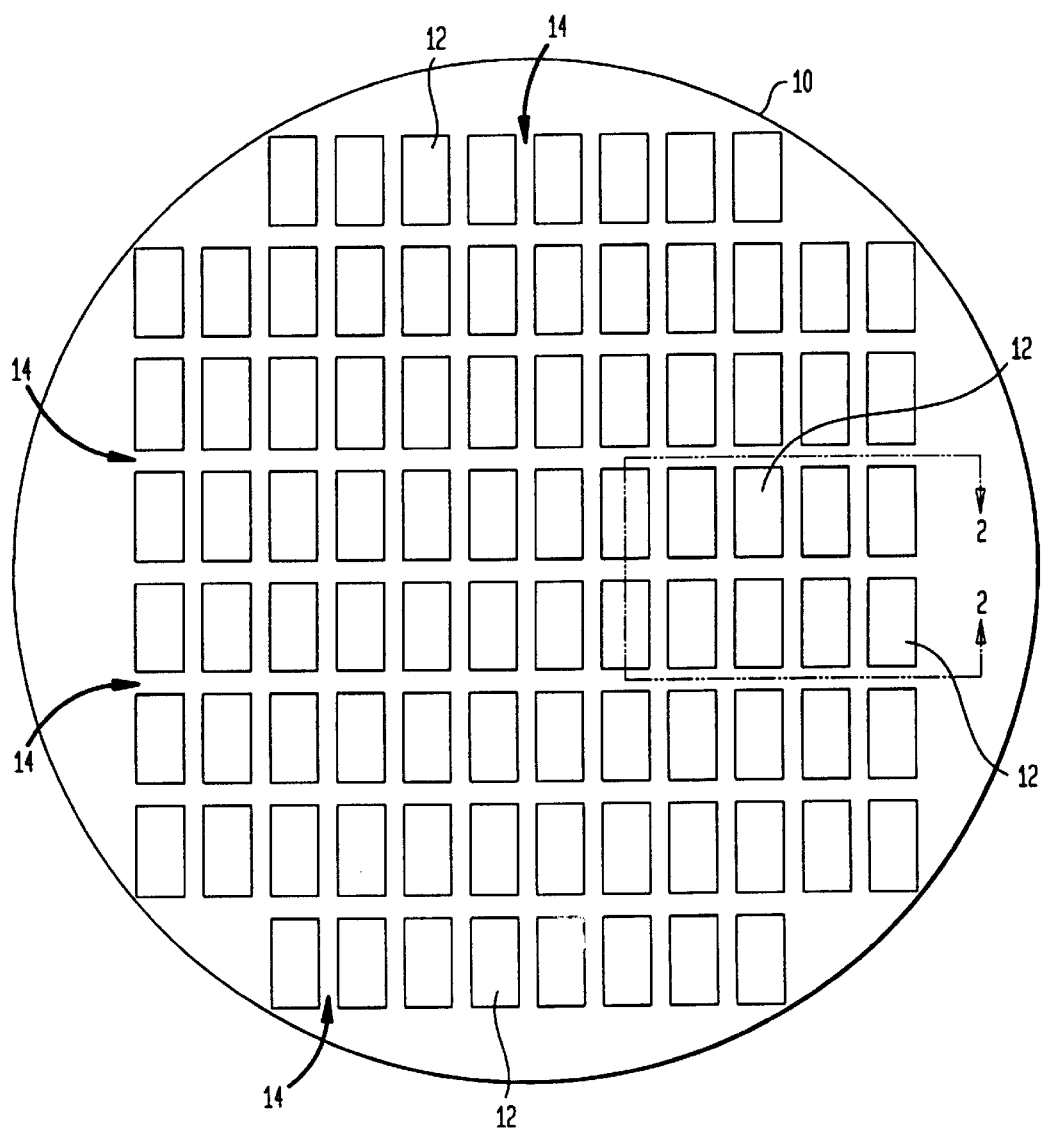
FIG. 1 is a plan view, simplified sketch of a semiconductor wafer having a plurality of integrated circuit chips according to the PRIOR ART.
Figure 2:
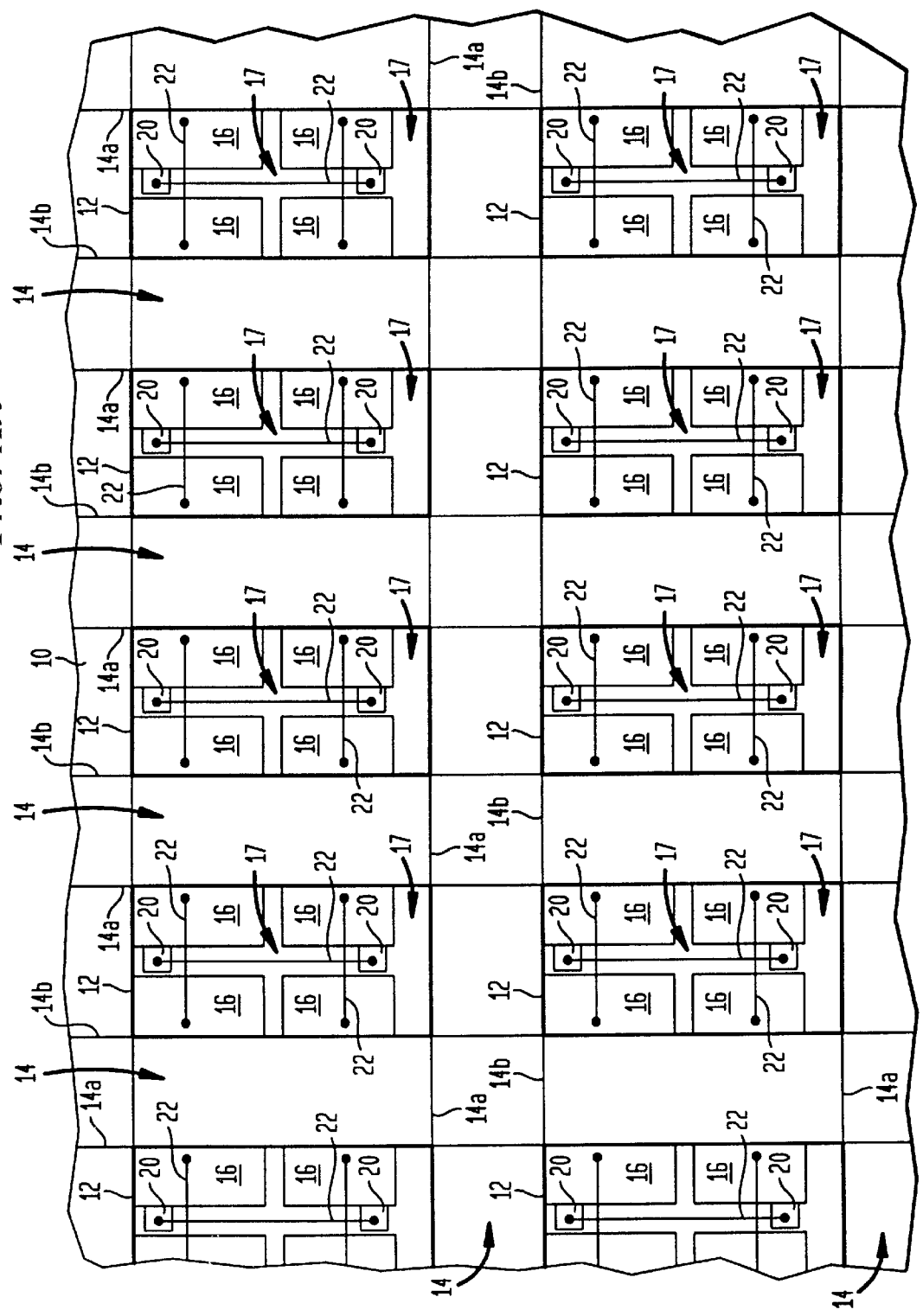
FIG. 2 is an exploded view of a portion of the wafer of FIG. 1.
Figure 3:
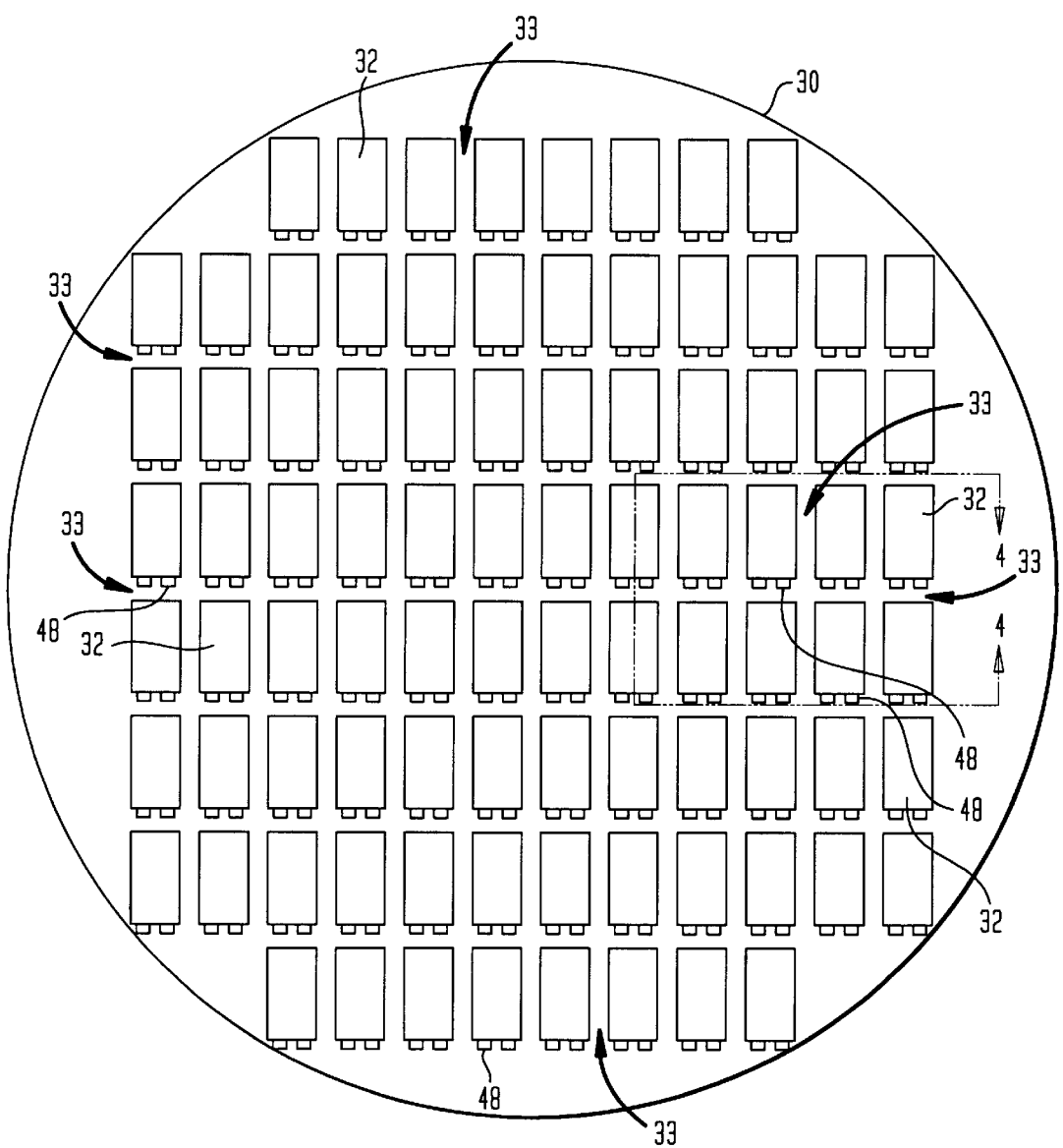
FIG. 3 is a plan view, simplified sketch of a semiconductor wafer having a plurality of integrated circuit chips according to the invention.

Referring now to FIG. 3, a semiconductor wafer 30 is shown having a plurality of identical integrated circuit chips, here DRAM chips 32 therein, is shown. The individual chips 32 are separated by separating regions, here scribe lines, or kerfs, 33. The borders of the scribe lines 33 are provided by crack-stop lines labeled 33a, 33b in an enlarged view of a portion of the wafer 30 shown in FIG. 4. Here, each one of the chips 32 includes, as with the chips 12 in FIG. 1, memory array regions 16, here four memory array regions 16 and non-array, or peripheral regions 17'. Here, in this example, each one of the chips 32 is identical in construction. Each array region 16 includes the DRAM memory cells and associated row and column decoders, not shown. It should be noted that periphery electrical components, here for example, voltage generators 48, are provided in the separating regions 33. More particularly, here a pair of the voltage generators 48 is disposed in a portion of the scribe line 33 adjacent to a corresponding one of the chips 32. Each pair of generators 48 is electrically connected to the adjacent, corresponding one of the chips 32, here for example to the array regions 40 of such chip 32, through power busses 50 formed on the chip 32, as indicated. It is noted that the generators 48 have electrical contacts 53, as shown more clearly in FIG. 4 and such electrical contacts are connected to the power busses 50.

Thus, a semiconductor wafer 30 is provided having formed thereon a plurality of semiconductor chips 32, such chips 32 being separated by separating regions 33 in the wafer 30, such wafer 30 having a plurality of electrical contacts 53.

Figure 4:
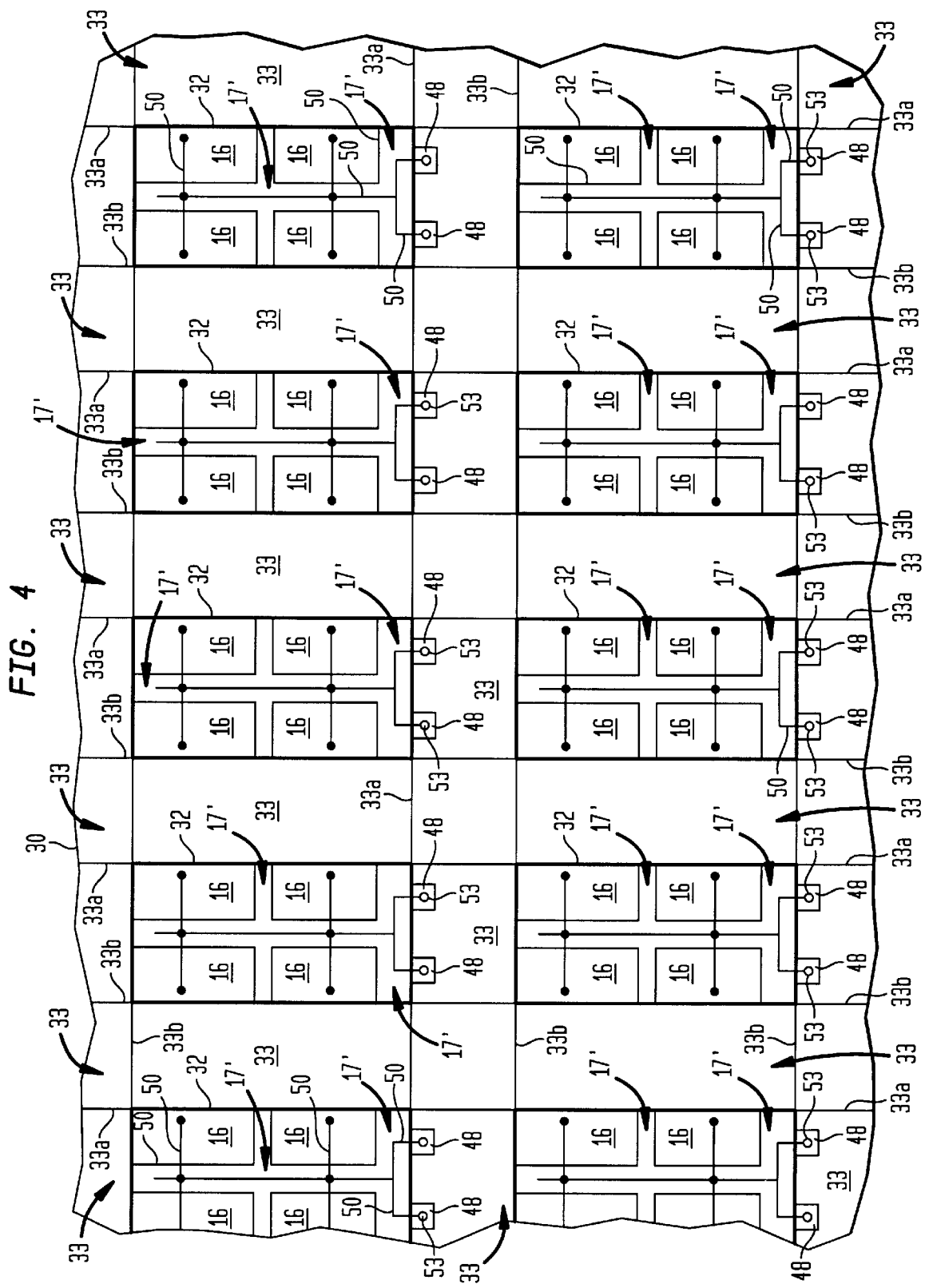
FIG. 4 is an exploded view of a portion of the wafer of FIG. 3 having a plurality of the integrated circuit chips therein, such portion being enclosed in the arrow labeled 4—4 in FIG. 3.
Figure 5:
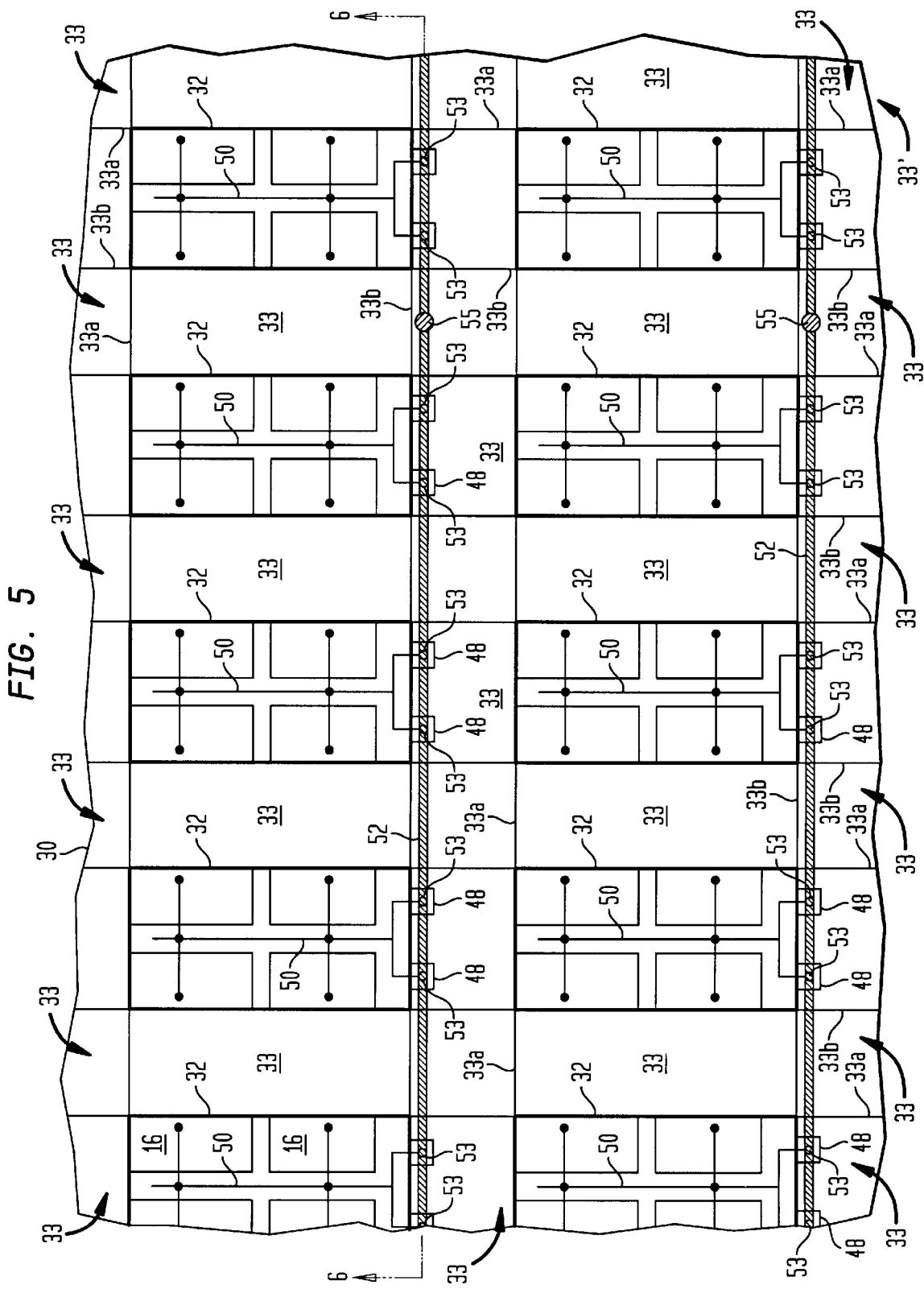
FIG. 5 is a diagrammatical plan view of the portion of the wafer shown in FIG. 4 with a dielectric member disposed over such portion of the wafer and with such dielectric member having electrical conductors thereon in contact with electrical contacts on the chips in such portion of the wafer, such electrical conductors being shown using cross-hatching in FIG. 5.
Figure 6:
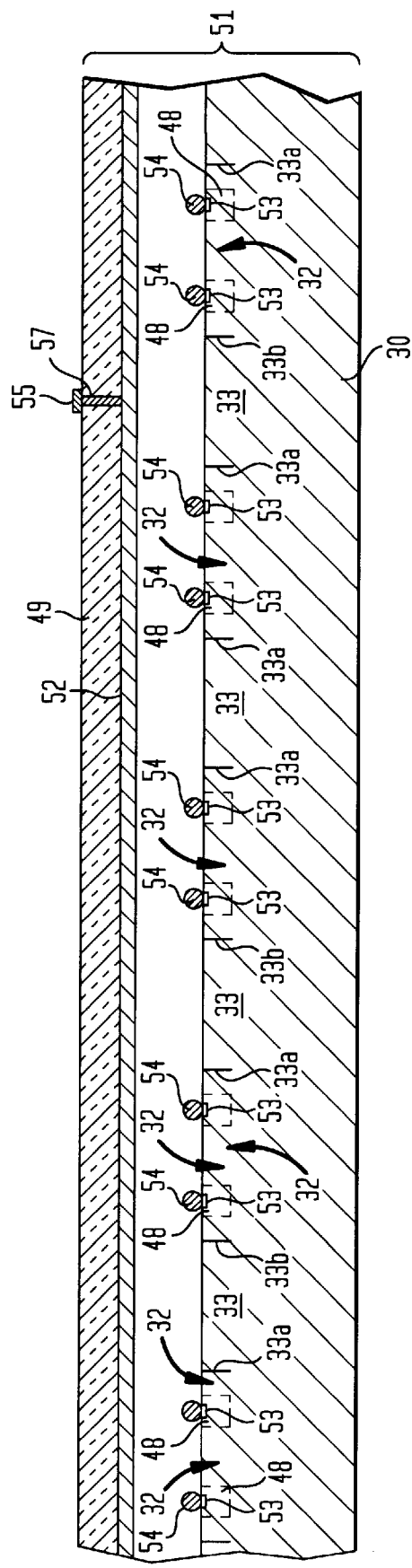
FIG. 6 is an exploded, cross sectional view of the package of FIG. 5 such cross section being taken along line 6—6 in FIG. 5.

Having fabricated the semiconductor wafer 30 as shown in FIGS. 3 and 4, a dielectric member 49, such as a thin printed circuit board, shown more clearly in FIG. 6 is provided with patterned electrical isolated electrical conductors 52 on one surface, here the inner surface of the dielectric member 49. The dielectric member 49 has an electrical contact 55 on the opposite, here outer surface thereof as indicated. The contact 55 is electrically connected to the electrical conductor 52 through via conductor 57. The dielectric member 49 may be a single member having the conductors formed on one surface of such member 50, as shown in FIGS. 5 and 6. The dielectric member 49 may be a multi-level, e.g., laminated member, having electrical conductors 52 in various dielectric layers thereof. In either case, one inner surface of the dielectric member 49 has at least one electrical conductor 52 which is electrically connected to the electrical contact 55 using a conductive via 57. The dielectric member 49, here having a diameter the same, or larger than the diameter of wafer 30, is placed over the surface of the wafer 30 as indicated in FIG. 6, here the electrical conductors 52 are indicated by hatched lines for convenience.

Thus, a dielectric member 49 is provided having electrical conductors 52. The dielectric member 49 is positioned over the wafer 30 with the electrical conductors 52 being disposed on the plurality of electrical contacts 53 and with such electrical conductors 52 spanning the separating regions 33, as indicated in FIGS. 5 and 6. It is noted then that the electrical conductor 52 is thus electrically connected to the buss 50 through the contacts 53, as noted above.

Figure 10:
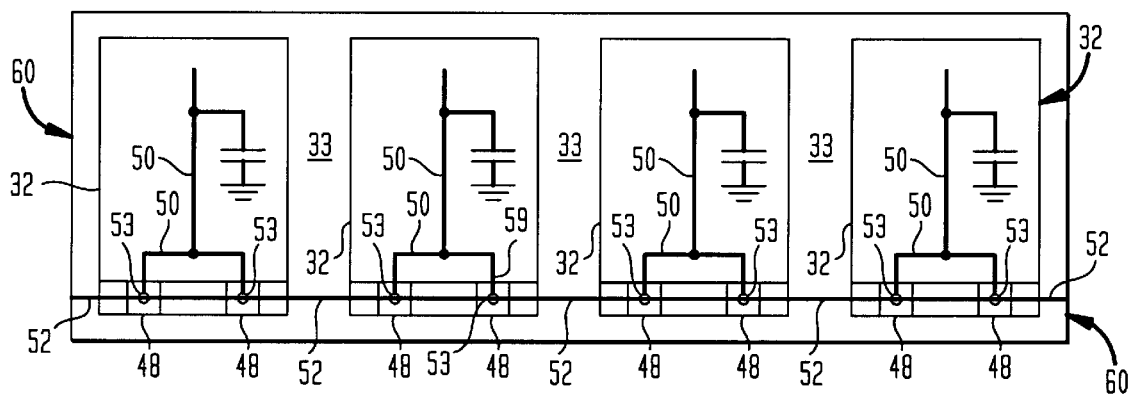
FIG. 10 is a schematic diagram of the structure shown in FIGS. 5, 6 and 7 according to the invention.

Next, the positioned dielectric member 49 is connected to the semiconductor wafer 30 to provide a unitary structure 51 as indicated in FIG. 6. The unitary structure 51 is separated along the scribe lines 32 into a plurality of packages 60, and exemplary one of such packages 60 being shown in FIG. 7. Thus, in this example, each package 60 has a plurality, here four, of the chips 32 with the electrical contacts 53 of the four chips 32 in such package 60 being electrically connected the spanning electrical conductor 52. A schematic diagram of the package is shown in FIG. 10.

Figure 7:
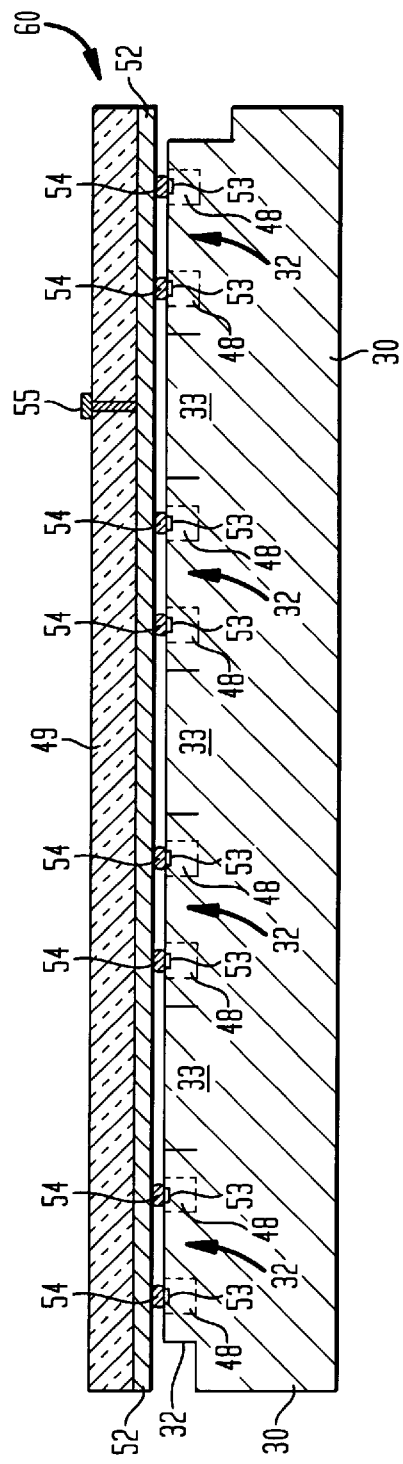
FIG. 7 is a cross sectional view of a semiconductor package according to the invention, such package having a separated, fractional portion of the wafer of FIGS. 5 and 6, and overlying fractional portion of the dielectric member of FIGS. 5 and 6.
Figure 8:
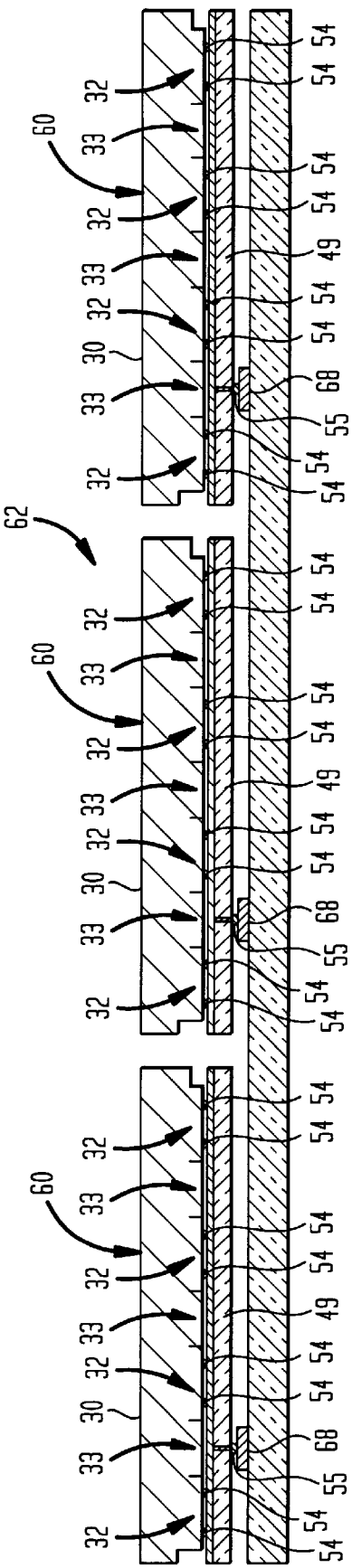
FIG. 8 is a packaging assembly having the package of FIG. 7 connected to a portion of a printed circuit board according to the invention.

Next, a plurality of the packages 60 are arranged in a memory module 62 as indicated in FIG. 8. More particularly, here each memory module 62 includes a plurality of, here three, of the packages 60 shown in FIG. 7 and a printed circuit board 66 an electrical interconnects 68 thereon. The memory module 62 is fabricated by mechanically and electrically connecting the four packages 60 to the printed circuit board 66. More particularly, the electrical contacts 55 are disposed on and electrically connected to the electrical interconnects 68.

It is noted that with the packages 60 arranged as described in FIG. 7, each one of the voltage generators 48 is no longer assigned (i.e., electrically connected to) a single integrated circuit chip 32. Thus, while in the prior art each chip has its own generator, such generator must be calibrated individually to the particular chip. Here, however, by combining (i.e., electrically interconnecting) the generators 48 and then connecting them to all chips 32 in the package 60, the generator 48 produced voltages are the same for all chips 32 in the package 60. This results in less on-chip voltage variation and more constant timings during operation of the chips 32. A schematic diagram of package 60 is shown in FIGS. 5, 6 and 7 is shown in FIG. 10. Thus, it is noted that here each chip 32 has a pair of here identical voltage generators 48 formed in the separating regions 33, as described above in connection with FIGS. 4–8. As described above in connection with FIGS. 5 and 6, the voltage generators 48 have electrical contacts 53 which are connected through the electrical conductor 52. Further, as noted above in connection with FIGS. 4–8 these electrical contacts are connected to the busses 50, as indicated schematically in FIG. 10. Thus, with this average voltage provided by all of the here eight voltage generators is supplied to here all four chip 32.

Figure 11:
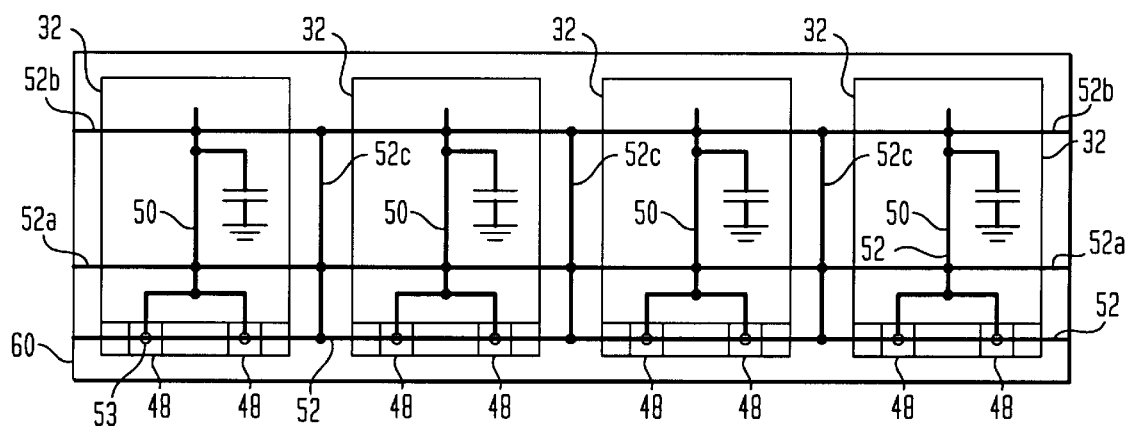
FIG. 11 is a schematic diagram of a structure according to an alternative embodiment of the invention.

Referring to FIG. 11, an alternative arrangement is shown where additional electrical conductors 52a, 52b and 52c are formed on the dielectric member 59 (FIG. 7) along with electrical conductor 52. Such an arrangement of the electrical conductors 52, 52a, 52b and 52c provides a more effective distribution of the voltages provided by the here eight voltage generators 48.

Figure 9C:
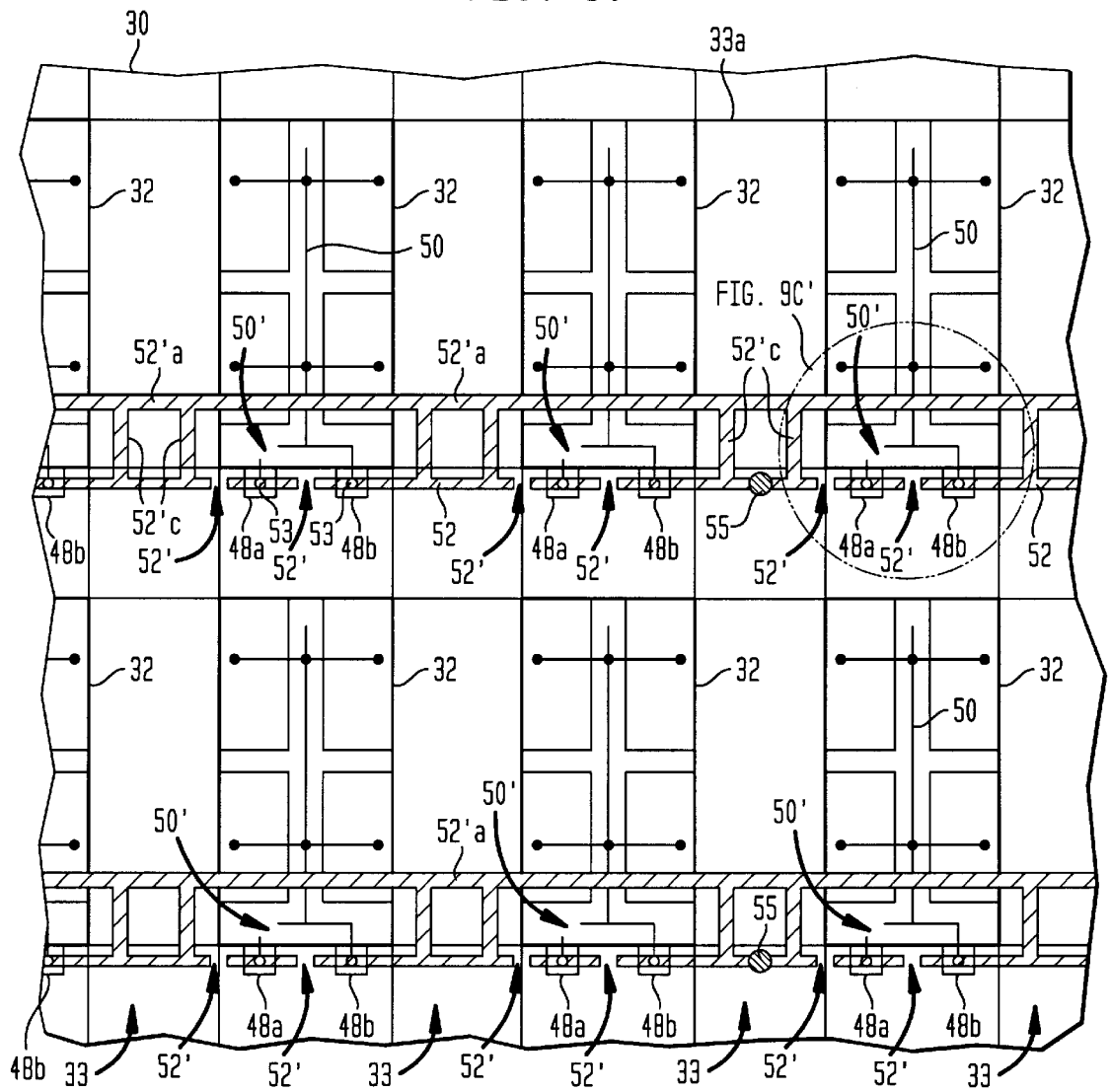
Figure 9C:
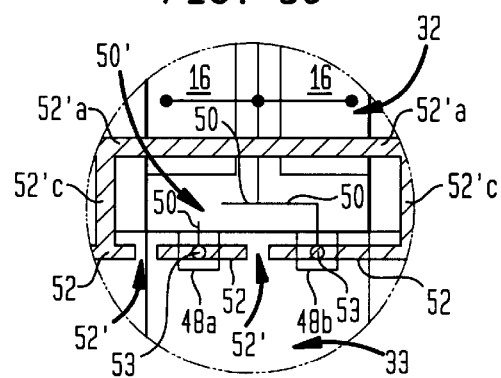

Referring now to FIGS. 9A–9D another embodiment of the invention is shown. Referring first to FIG. 9A, each one of the chips 32 has initially connected to it via bus 50 a pair of voltage generators 48a, 48b. Here, each one of the pair of generators 48a, 48b produces a different voltage. It is noted that here the dielectric 49 (described above in connection with FIGS, 5 and 6) is disposed on, and connected to, the wafer 30 as described above in connection with FIGS. 5 and 6. Here, however, the dielectric 49 has, in addition to electrical conductor 52, electrical conductors 52'a and 52'c arranged as shown. It is noted that electrical conductor 52 is in contact with electrical contacts 53 as described above in connection with FIGS. 5 and 6. Electrically connected to such conductor 52 are the conductors 52'a and 52'c. Thus, at this stage in the fabrication, electrical conductors 52'a and 52'c are electrically connected to contacts 53 and hence are electrically connected to bus 50 of each of the chips 32.

Next, and referring to FIG. 9B, the one of the pair of electrical contacts 53 in contact with voltage generator 48a is electrically disconnected from the bus 50, here by open-circuiting a laser fusible link to thereby produce gaps 50' as indicated more clearly in FIG. 9B'. Thus, the voltage generators 48a are electrically disconnected from the buses 50 while the voltage generators 48b remain electrically connected to such buses 50, as indicated.

Next, and referring to FIG. 9C, a laser is used to form open circuits 52' in the conductor 52, as indicated more clearly in FIG. 9C'. It is noted that there are a pair of gaps 52' to the right and to the left of each voltage generator 48a. Thus each voltage generator 48a is electrically disconnected from electrical contact 55. To put it another way, it should be noted that because of gaps 52', only the voltage generators 48b are electrically connected 53 together and such voltage generators 48a are electrically isolated from voltage generators 48b. Further, because of the gaps 50' described above in connection with FIGS. 9B and 9B', the electrical conductor 52 with the gaps 52' is electrically connected to the electrical contact 55 and is electrically connected to only generator 48b.

Figure 9D:
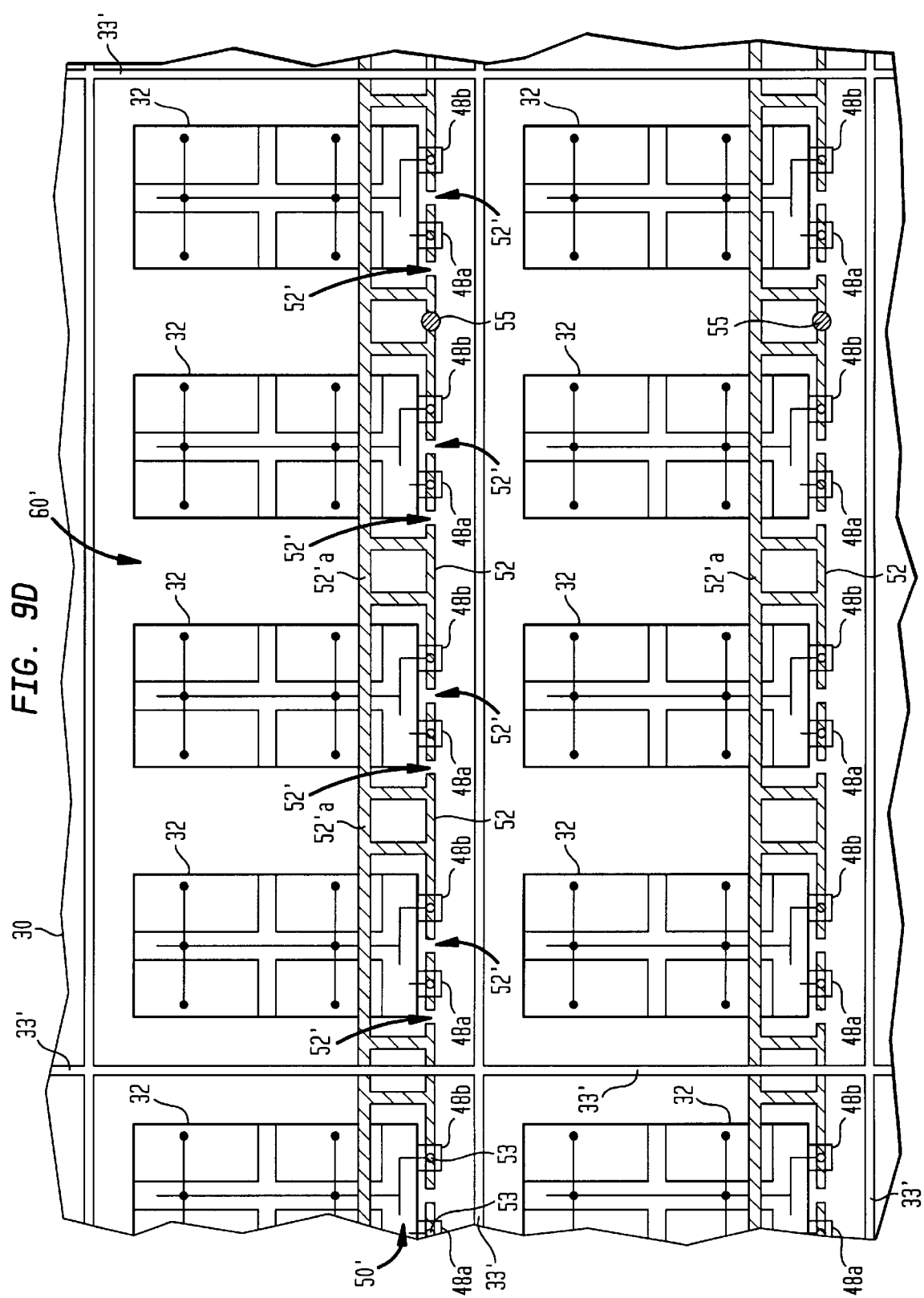
Figure 12:
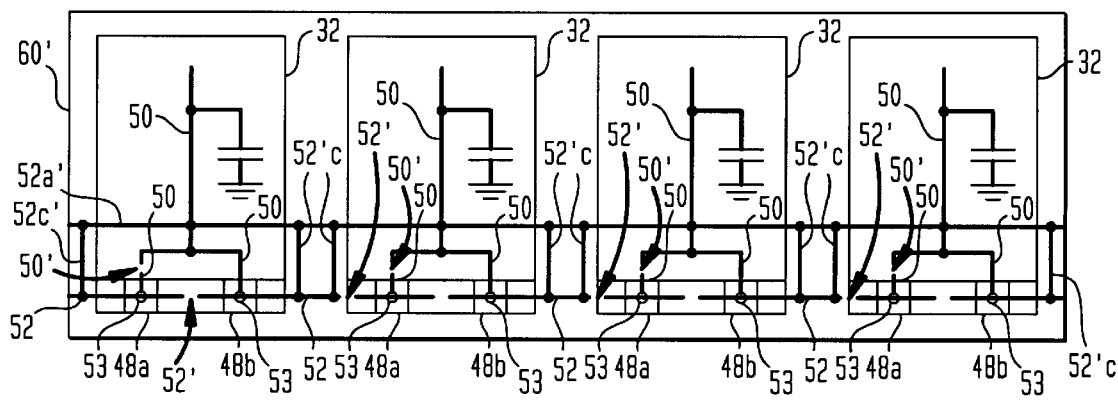
FIG. 12 is a schematic diagram of the structure shown in FIG. 9D.

Referring now to FIG. 9D, the structure shown in FIG. 9D is sawed along lines 33' and thereby separated into package of four electrically interconnected chips to form a plurality of packages 60'. The schematic diagram of one of the packages 60' is shown in FIG. 12.

Figure 13:
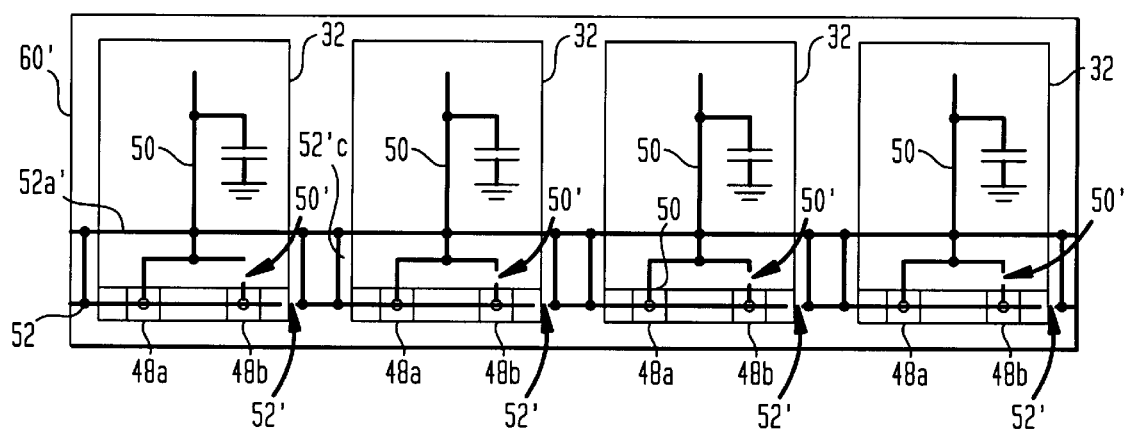
FIG. 13 is a schematic diagram of a structure according to an alternative embodiment of the invention.

It is noted that a similar procedure may be used where generator 48a is to be electrically connected to bus 50 and where generator 48b is to be electrically isolated from bus 50. The schematic diagram for such an arrangement is shown in FIG. 13.

Figure 14:
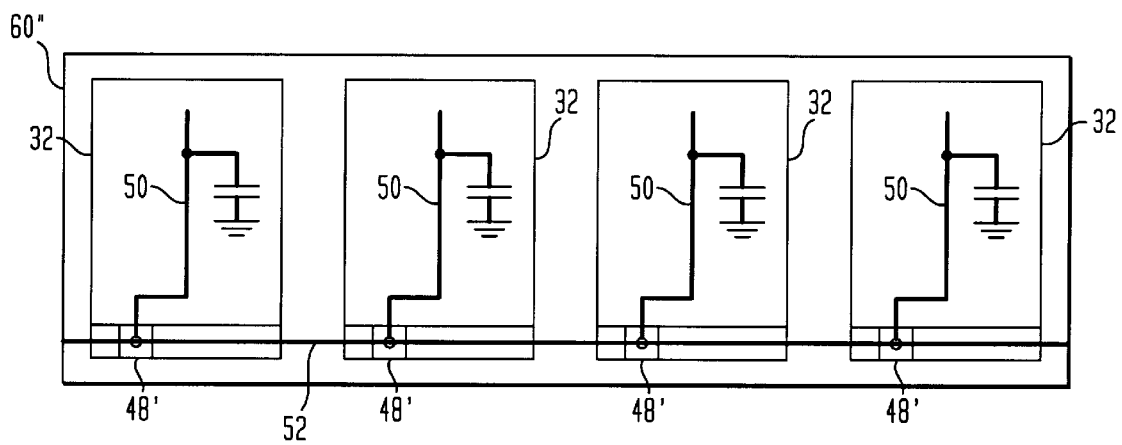
FIG. 14 is a schematic diagram of a structure according to an alternative embodiment of the invention.

From the above, it follows that other package arrangements may be provided. For example, referring to FIG. 14 package 60" has four similar voltage generators 48', one adjacent to a corresponding one of the four chips 32, are interconnected via conductor 52 to provide an average voltage to the chips 32 via busses 50. Thus, from the above it should be noted that because some memory packages 60, 60', 60" have configurations in which not all of the individual chips 32 are active at one time, with the arrangement according to the invention described above, the generators 48 in the package 60 may be shared between chips 32 in the package 60 thus improving the chip-count per wafer since the generator size may be reduced. Still further, because the generators 48, 48a, 48b need not be placed in the chip 32 but rather in the separating regions 33 between the chips 32, the number of chips 32 per wafer 30 (FIG. 3) may be increased. This arrangement also allows the capacitance of other chips within the package to stabilize the generated voltages with the memory package. Further, with this arrangement, the bus width on the chip may be reduced to thereby reduce chip area.

A number of embodiments of the invention have been described. Nevertheless, it will be understood that various modifications may be made without departing from the spirit and scope of the following claims.

What is claimed is:

1. A semiconductor package, comprising:
   a fractional portion of a semiconductor wafer having a plurality of integrated circuit chips thereon, such chips being separated by regions in the fractional portion of the wafer, such fractional portion of the wafer having a plurality of electrical contacts;
   a dielectric member having an electrical conductor thereon, such electrical conductor being electrically connected to the plurality of electrical contacts to electrically interconnect such plurality of chips, portions of the dielectric member with portions of the electrical conductor thereon spanning the regions in the fractional portion of the wafer.

2. The semiconductor package recited in claim 1 wherein the dielectric member is a self-supporting dielectric member.

3. The semiconductor package recited in claim 1 wherein the dielectric member is a printed circuit board.

4. A semiconductor package, comprising:
   a fractional portion of a semiconductor wafer having a plurality of integrated circuit chips thereon, such chips being separated by regions in the fractional portion of the wafer, such fractional portion of the wafer having a plurality of electrical contacts;
   a dielectric member;
   an electrical conductor disposed on the dielectric member, such electrical conductor being electrically connected to the plurality of electrical contacts of the plurality of chips to electrically interconnect such plurality of chips, portions of the dielectric member and portions of the electrical conductor thereon spanning the regions in the fractional portion of the wafer, such portions of the dielectric member and the portions of the electrical conductor thereon being elevated above the regions in the fractional portion of the wafer.

5. The semiconductor package recited in claim 4 wherein the dielectric member is a self-supporting dielectric member.

6. The semiconductor package recited in claim 4 wherein the dielectric member is a printed circuit board.

7. A semiconductor packaging arrangement, comprising:
   (A) a printed circuit board having an electrical interconnect thereon;
   (B) a semiconductor package, comprising:
      (i) a fractional portion of a semiconductor wafer having a plurality of integrated circuit chips thereon, such chips being separated by regions in the fractional portion of the wafer, such fractional portion of the wafer having a plurality of electrical contacts;
      (ii) a self-supporting dielectric member having an electrical conductor thereon, such electrical conductor electrically being electrically connected to the plurality of electrical contacts of the plurality of chips to electrically interconnect such plurality of chips, portions of the electrical conductor spanning the regions in the fractional portion of the wafer; and
   (C) a conductor for electrically connecting the electrical conductor of the package to the electrical interconnect of the printed circuit board.

8. A method for providing a packaging arrangement, comprising:
   providing a semiconductor wafer having formed thereon a plurality of semiconductor chips, such chips being separated by regions in the wafer, such wafer having a plurality of electrical contacts;
   providing a dielectric member having thereon an electrical conductor;
   positioning the dielectric member over the wafer with the electrical conductor being disposed on the plurality of electrical contacts and with such electrical conductor spanning the regions;
   connecting the positioned dielectric member to the semiconductor wafer to provide a unitary structure;
   separating the unitary structure into a plurality of packages, each one of packages having a plurality of the chips with the electrical contacts of the plurality of the chips in such package being electrically connected to a corresponding portion of the spanning electrical conductor in such package.

9. The method recited in claim 8 including configuring electrical functionality of the assembly comprising:
   selectively cutting the electrical conductor on the dielectric member and fusing selected regions of an interconnecting bus on the chips.

10. The method recited in claim 8 including providing a printed circuit board having an electrical interconnect thereon; and, electrically interconnecting the electrical conductor of the package to the electrical interconnect.

11. A semiconductor memory, comprising:
    (A) a fractional portion of a semiconductor wafer, such fractional portion having:
       a plurality of integrated circuit chips, each one of such chips comprising:
          a memory array region;
          wherein the chips have separating regions therebetween;
          a periphery electrical component disposed in one of the separating regions;
    (B) a self-supporting dielectric member having an electrical interconnect thereon, such electrical interconnect electrically connecting the array region of one of the chips to the periphery electrical component; and (C) a fusible link disposed in the one of the memory array regions electrically connecting the electrical interconnect and the periphery electrical component.

12. A semiconductor memory, comprising:
(A) a fractional portion of a semiconductor wafer, such fractional portion having:
a plurality of integrated circuit chips, each one of such chips comprising:
a memory array region;
wherein the chips have separating regions therebetween;
a periphery electrical component disposed in one of the separating regions;
(B) a self-supporting dielectric member having an electrical interconnect thereon, such electrical interconnect electrically connecting the array region of one of the chips to the periphery electrical component; and
(C) a fusible link disposed in one of the plurality of integrated circuit chips and electrically connecting the electrical interconnect and the periphery electrical component.

13. A semiconductor memory package, comprising:
(A) a fractional portion of a semiconductor wafer, such fractional portion having:
a plurality of integrated circuit chips, each one of such chips comprising:
a memory array region; and
wherein the chips have separating regions therebetween;
a periphery electrical component disposed in one of the separating regions;
(B) a self-supporting dielectric member having an electrical interconnect thereon, such electrical interconnect electrically connecting the array region of the one of the chips to the periphery electrical component, such electrical interconnect elevated above the one of the separating regions.

14. A semiconductor package, comprising:
a fractional portion of a semiconductor wafer having a plurality of integrated circuit chips thereon, such chips having separating regions between them, the fractional portion of the wafer having a plurality of electrical contacts electrically connected to the chips;
a self-supporting dielectric member having an electrical conductor thereon, such electrical conductor electrically connected to the plurality of electrical contacts to electrically interconnect such chips with portions of the electrical conductor spanning the separating regions between the chips in the fractional portion of the wafer, such conductor being elevated above the regions in the fractional portion of the wafer.

15. A semiconductor package, comprising:
a fractional portion of a semiconductor wafer having a plurality of integrated circuit chips thereon, such chips being separated by separating regions between them; such fractional portion of the wafer having a plurality of electrical contacts electrically connected to the chips;
a self-supporting dielectric member having an electrical conductor thereon, such electrical conductor electrically connecting the plurality of electrical contacts to electrically interconnect such chips with portions of the electrical conductor and the dielectric member spanning the separating regions between the chips in the fractional portion of the wafer.

16. A semiconductor package, comprising:
a fractional portion of a semiconductor wafer having:
a plurality of integrated circuit chips thereon, such chips have separating regions between them;
electrical components;
a self-supporting dielectric member having an electrical conductor thereon, such electrical conductors electrically connecting the plurality of electrical contacts to electrically interconnect such chips with the electrical components, such conductor elevated above the separating regions in the fractional portion of the wafer.

17. The package recited in claim 16 wherein the electrical components are disposed in the separating regions.

18. A semiconductor memory, comprising:
a fractional portion of a semiconductor wafer, such fractional portion of the wafer comprising:
a plurality of integrated circuit chips, each one of such chips having a memory array region;
separating regions between the chips;
a periphery electrical component disposed in one of the separating regions
a self-supporting dielectric member having an electrical interconnect thereon, such electrical interconnect electrically connecting the chip to the periphery electrical component, such electrical interconnect elevated above one of the separating regions in the fractional portion of the wafer.

19. A semiconductor memory, comprising:
a fractional portion of a semiconductor wafer, such fractional portion of the wafer comprising:
a plurality of integrated circuit chips, each one of such chips having a memory array region, the chips have separating regions therebetween;
a peripheral electrical component disposed in one of the separating regions;
a self-supporting dielectric member having an electrical interconnect thereon, such electrical interconnect electrically connecting the chip to the peripheral electrical component; and
a fusible link disposed in the one of the memory array regions and electrically connecting the electrical interconnect and the periphery electrical component.

20. A semiconductor module, comprising:
a printed circuit board having an electrical interconnect thereon; and
a semiconductor package mounted to the printed circuit board, such semiconductor package comprising:
a fractional portion of a semiconductor wafer having a plurality of integrated circuit chips thereon, such chips being separated by regions in the fractional portion of the wafer, such fractional portion of the wafer having a plurality of electrical contacts electrically connected to the chips;
a dielectric having an electrical conductor thereon, such electrical conductor being electrically connected to the plurality of electrical contacts of the plurality of chips to electrically interconnect such plurality of chips with portions of the electrical conductor spanning the regions in the fractional portion of the wafer; and
a connector for electrically connecting the electrical conductor of the package to the electrical interconnect of the printed circuit board.

21. A method for providing a packing arrangement, comprising:

provniding a semiconductor wafer having formed thereon a plurality of semiconductor chips, such chips being separated by regions in the wafer, such wafer having a plurality of electrical contacts electrically connected to the chips;

providing a dielectric member having an electrical conductor;

positioning the dielectric member over the wafer with the electrical conductor being disposed on the plurality of electrical contacts and with such dielectric member and the electrical conductor thereon spanning the regions; and connecting the positioned dielectric member to the semiconductor wafer to provide a unitary structure.

22. The method recited in claim 21 including separating the structure into a plurality of packages, each one of the of packages having a plurality of the chips with the electrical contacts of the plurality of the chips in such package being electrically connected to a corresponding portion of the spanning electrical conductor in such package.

* * * * *